United States Patent
Klein et al.

(10) Patent No.: US 10,607,821 B2
(45) Date of Patent: Mar. 31, 2020

(54) SPUTTERING SYSTEM AND METHOD INCLUDING AN ARC DETECTION

(71) Applicant: MKS Instruments, Inc., Andover, MA (US)

(72) Inventors: Jesse N. Klein, West Henrietta, NY (US); David C. Halstead, Cuba, NY (US); Michael R. Gilbert, Hemlock, NY (US)

(73) Assignee: MKS Insturments, Inc., Andover, MA (US)

( * ) Notice: Subject to any disclaimer, the term of this patent is extended or adjusted under 35 U.S.C. 154(b) by 457 days.

(21) Appl. No.: 15/452,896

(22) Filed: Mar. 8, 2017

(65) Prior Publication Data

US 2017/0178879 A1  Jun. 22, 2017

Related U.S. Application Data

(62) Division of application No. 12/174,893, filed on Jul. 17, 2008, now Pat. No. 9,613,784.

(51) Int. Cl.
*H01J 37/34* (2006.01)
*H01J 37/32* (2006.01)

(52) U.S. Cl.
CPC .... *H01J 37/3476* (2013.01); *H01J 37/32027* (2013.01); *H01J 37/32935* (2013.01); *H01J 37/32944* (2013.01); *H01J 37/34* (2013.01); *H01J 37/3444* (2013.01); *H01J 2237/0206* (2013.01)

(58) Field of Classification Search
CPC .......... H01J 37/32027; H01J 37/32935; H01J 37/34; H01J 37/3476; H01J 37/32944; H01J 37/3444; H01J 2237/0206
See application file for complete search history.

(56) References Cited

U.S. PATENT DOCUMENTS

| | | |
|---|---|---|
| 5,241,152 A | 8/1993 | Anderson et al. |
| 5,698,082 A | 12/1997 | Teschner et al. |

(Continued)

FOREIGN PATENT DOCUMENTS

| | | |
|---|---|---|
| CN | 1248299 A | 3/2000 |
| EP | 0639655 A1 | 2/1995 |

(Continued)

OTHER PUBLICATIONS

European Examination Report for Application No. 09798356.3 dated Mar. 6, 2018.

(Continued)

*Primary Examiner* — Michael A Band
(74) *Attorney, Agent, or Firm* — Harness, Dickey & Pierce, P.L.C.

(57) ABSTRACT

A sputtering system that includes a sputtering chamber having a target material serving as a cathode, and an anode and a work piece. A direct current (DC) power supply supplies electrical power to the anode and the cathode sufficient to generate a plasma within the sputtering chamber. A detection module detects the occurrence of an arc in the sputtering chamber by monitoring an electrical characteristic of the plasma. In one embodiment the electrical characteristic monitored is the impedance of the plasma. In another embodiment the electrical characteristic is the conductance of the plasma.

6 Claims, 4 Drawing Sheets

(56) References Cited

U.S. PATENT DOCUMENTS

| | | |
|---|---|---|
| 6,022,462 A | 2/2000 | Ikeda et al. |
| 6,416,638 B1 | 7/2002 | Kuriyama et al. |
| 6,621,674 B1 | 9/2003 | Zahringer et al. |
| 6,736,944 B2 | 5/2004 | Buda |
| 6,740,207 B2 | 5/2004 | Kloeppel et al. |
| 6,808,607 B2 | 10/2004 | Christie |
| 6,876,205 B2 | 4/2005 | Walde et al. |
| 7,068,045 B2 | 6/2006 | Zuercher et al. |
| 7,247,221 B2 | 7/2007 | Stowell, Jr. |
| 7,253,637 B2 | 8/2007 | Dvorak et al. |
| 7,262,606 B2 | 8/2007 | Axenbeck et al. |
| 7,292,045 B2 | 11/2007 | Anwar et al. |
| 7,305,311 B2 | 12/2007 | van Zyl |
| 7,768,269 B2 | 8/2010 | Pipitone et al. |
| 9,408,288 B2 | 8/2016 | Valcore, Jr. et al. |
| 9,536,749 B2 | 1/2017 | Marakhtanov et al. |
| 2004/0182697 A1 | 9/2004 | Buda |

FOREIGN PATENT DOCUMENTS

| | | |
|---|---|---|
| EP | 1195793 A2 | 4/2002 |
| JP | 61-030665 A | 2/1986 |
| JP | 7034239 A | 2/1995 |
| JP | 7078275 A | 8/1995 |
| JP | 08041636 | 2/1996 |
| JP | 10021586 | 1/1998 |
| JP | 2004-006147 A | 1/2004 |
| JP | 2004225100 A | 8/2004 |
| JP | 2007-186725 A | 7/2007 |
| KR | 1998001113 | 4/1998 |
| KR | 100204450 B1 | 6/1999 |
| SU | 630589 A * | 9/1978 |

OTHER PUBLICATIONS

International Search Report for Intenational Patent Application No. PCT/US2009/039708 dated Nov. 23, 2009.

Office Action for Chinese Application No. 200980112015.4 dated Nov. 23, 2011.

International Search Report for Intenational Patent Application No. PCT/US2009/03978 dated Nov. 23, 2009.

Korean Office Action for Korean Patent Application No. 10-2010-7021573, dated Feb. 19, 2013, and English transalation thereof.

Office Action for Japanese Application No. 2011518743 dated May 30, 2013 and English translation thereof.

Office Action for Japanese Application No. 2011518743 dated Nov. 11, 2010.

European Search Report for Application No. 09798356.3-1551/ Publication No. 2304070 dated Dec. 10, 2013.

\* cited by examiner

SPUTTERING SYSTEM AND METHOD INCLUDING AN ARC DETECTION

CROSS-REFERENCE TO RELATED APPLICATIONS

This application is a division of U.S. patent application Ser. No. 12/174,893 filed on Jul. 17, 2008. The entire disclosure of the above application is incorporated herein by reference.

FIELD

The present disclosure relates generally to plasma-based sputtering systems, and more particularly to a sputtering system that employs an arc detection system for detecting when an arc is occurring within a DC plasma sputtering chamber.

BACKGROUND

With the increasing demand for optical and disk media such as CD, DVD, MD, MO, DLC films and hard disks, the importance of the sputtering processes that are used in the manufacture of these media continues to increase. There are numerous types of sputtering systems, all of which are employed to deposit insulating or conductive coatings on devices ranging from semiconductors to drill bits. The films that are generally applied to optical and disk media are typically created with a sputtering process having limited control over the sputtering gas. More specifically, with present day sputtering systems and methods, a significant fraction of atmosphere and petrochemical volatilities are present in the sputtering chamber at the beginning of the sputtering process.

In a typical DC plasma-based sputtering system, atmosphere is introduced into a plasma chamber at the very beginning of the sputtering process. The atmosphere combines with freed target material present within the chamber. The resulting compound, typically comprising oxides and nitrides, may form a film on the surface of the target. This is referred to as "target poisoning", and will cause arcing between the cathode and anode within the sputtering chamber. Arcing, although inevitable in a DC plasma-based sputtering system, is a mixed blessing. The arc often removes the poisoning from the target but it may also generate undesirable particles that can damage the work piece upon which material is being deposited. Additional sources of arcing include contaminants within the sputtering chamber such as moisture, atmospheric gases and inclusions. Outgassing may also cause arcing. Outgassing is a condition that arises when gasses and/or impurities trapped in the work piece being coated, or in the target material itself, is released during the sputtering process.

In the past, numerous detection methods have existed for determining when an arc is occurring in the plasma chamber. These methods have involved using voltage limits and/or current limits to detect when the voltage or current reaches a predetermined threshold. Other methods for arc detection have involved sensing the change in the output voltage over time (dV/dT), and/or sensing the change in output current over time (dI/dT) of the DC supply. Each of the above mentioned methods has been implemented with several distinct techniques and varied circuitry. Each method, however, has limitations that can interfere with accurate arc detection and result in either false arc detection or failure to detect an arc occurrence. For example, when using a voltage limit based detection system, depending on the process and the strike condition encountered, it may not be possible to turn on the voltage limit detection circuit fast enough to detect the strike condition. Also, if the sputtering process uses a low DC output voltage setting in relation to the voltage threshold selected, then the reduced DC output voltage might reach a point where it starts to interfere with reliable operation of the arc detection circuit. More specifically, the DC supply voltage might be low enough so that the arc detection erroneously senses that an arc condition is occurring. Also, when an ignition finally occurs in the plasma, or the plasma has come out of an arc, care in enabling the voltage limit check circuitry has to be taken otherwise a false arc may be indicated.

When using a dV/dT or dI/dT based arc detection monitoring, one is looking for a fast transient voltage or current output from the DC supply, and relying on the detection of the fast delta in either output voltage or output current from the DC supply to signal that an arc condition has occurred. However, with a dI/dT based system, instances may be encountered where as the arc that has occurred is relatively slow moving, and therefore doesn't produce a fast delta in the sensed output current from the DC supply. In the industry, these types of arcs have been referred to as "fireball arcs" or "high impedance" arcs. Without the fast delta in output current, the dI/dT detection system may fail to detect the occurrence of an arc. A dV/dT based detection circuit similarly suffers from the limitation of being sometimes unable to discern the occurrence of a slow moving arc because of the slow drop in the sensed output voltage of the DC supply.

SUMMARY

In one aspect the present disclosure relates to a sputtering system. The system may include: a sputtering chamber having a target material serving as a cathode, and the sputtering chamber further including an anode and a work piece; a direct current (DC) power supply for supplying a electrical power to the anode and the cathode sufficient to generate a plasma within the sputtering chamber; and a detection module that detects the occurrence of an arc in the sputtering chamber by monitoring an electrical characteristic of the plasma.

In another aspect the present disclosure relates to a sputtering system that comprises: a sputtering chamber having a target material serving as a cathode, and the sputtering chamber further including an anode and a work piece; a direct current (DC) power supply for supplying electrical power to the anode and the cathode sufficient to generate a plasma within the sputtering chamber; a voltage sensor circuit adapted to sense an output voltage of the DC power supply being applied to across the cathode and the anode; a current sensor circuit adapted to sense an output current from the DC power supply that is flowing between the cathode and the anode during a sputtering operation; and a detection module responsive to the sensed current signal, to the sensed voltage signal, and further responsive to a pre-selected resistance, for using the sensed voltage signal, the sensed current signal and the pre-selected resistance to determine when the impedance has dropped to a level within the sputtering chamber that indicates an arc condition is occurring.

In still another aspect the present disclosure relates to a method for forming a sputtering system. The method may comprise: providing a sputtering chamber having a target material serving as a cathode, and the sputtering chamber further including an anode and a work piece; supplying direct current (DC) power to the anode and the cathode sufficient to generate a plasma within the sputtering chamber; and detecting the occurrence of an arc in the sputtering chamber by monitoring an electrical characteristic of the plasma during a sputtering operation being performed within the sputtering chamber.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description of various embodiments is merely exemplary in nature and is in no way intended to limit the present teachings, application, or uses.

Figure 1:
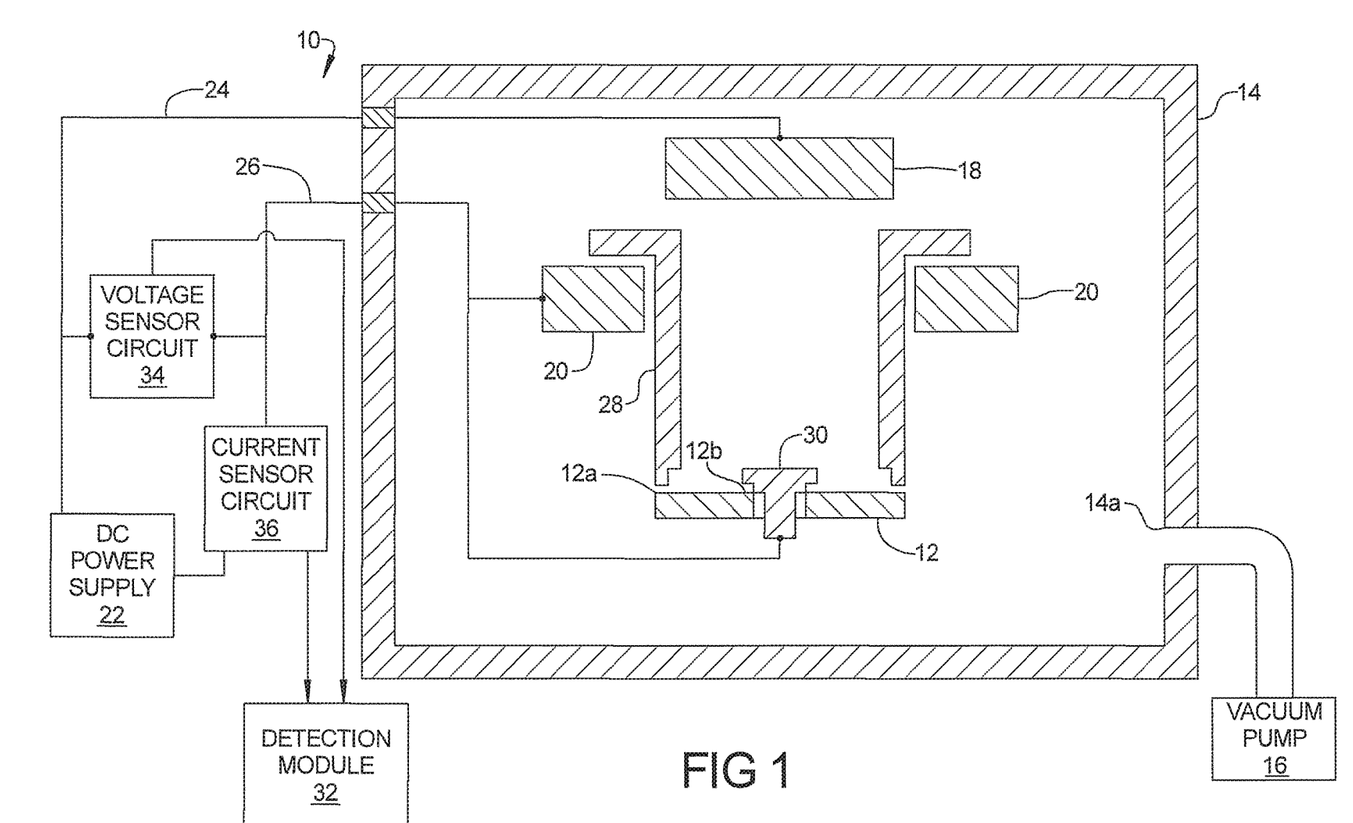
FIG. 1 is a block diagram of a sputtering system constructed in accordance with one embodiment of the present disclosure.

Referring to FIG. 1, a DC sputtering system 10 in accordance with one embodiment of the present disclosure is shown. The system 10 is used to deposit a coating on a work piece 12. The work piece 12 may comprise an optical disk storage media such as a compact disc (CD), a digital video disc (DVD), a drill bit, a glass panel, a cutting tool, a toy, or any other component or substrate that requires a sputtered surface film for its use and operation. Sputtering system 10 includes a sputtering chamber 14 that provides a controlled environment for the deposition process. A vacuum pump 16 is coupled to a port 14a in the sputtering chamber 14 and used to maintain a controlled internal pressure within the sputtering chamber. Sputtering target 18, configured as a cathode (and hereinafter referred to simply as the "cathode" 18), serves as a source of material for the sputtered coating that will be applied to the work piece 12 during the sputtering process.

Another piece of conductive material disposed within the sputtering chamber 14 is the anode 20. Cathode 18 and anode 20 are coupled to the output of a DC power supply 22 that supplies a high DC voltage (typically between about 200 Vdc-1000 Vdc, but is not limited to this range) across the cathode 18 and anode 20. The DC voltage output from the DC power supply 22 is supplied across the cathode 18 and anode 20 via output signal lines 24 and 26, respectively. This induces a plasma state within the sputtering chamber 14. The cathode 18 may be comprised of aluminum (Al) or any other material suitable to be employed in a sputtering process. Other suitable materials may be comprised of, for example, Gold (Au), Tantalum (Ta), and Titanium (Ti), just to name a few.

In a typical sputtering process the atmospheric gas introduced at the start of the process is a contaminant. The contaminant may be introduced when a part is loaded into the chamber 14. A controlled amount of a sputtering gas for providing anions that flow within the plasma is also supplied to the sputtering chamber 14. Typically argon or another noble gas is used as the sputtering gas, although the present disclosure is not limited to use with any specific type of sputtering gas.

FIG. 1 also illustrates one exemplary manufacturing application where the work piece 12 forms a circular optical disk that needs to be coated with a sputtered film. For this specific application an outer shield 28 and an inner shield 30 are positioned in the sputtering chamber 14 adjacent to the work piece 12 and serve to mask an outer edge 12a and an inner edge 12b, respectively, of the work piece 12. The shields 28 and 30 provide well defined outer and inner radii for the work piece 12. The outer shield 28 is preferably positioned between the cathode 18 and the work piece 12 to prevent the deposition of sputtered material on the outer edge 12a. The inner shield 30 is positioned within the outer shield 28 and closely adjacent to an inner radius 12b of the work piece 12 to prevent coating the inner edge with sputtered material from the cathode 18.

DC power supply 22 provides the electrical energy necessary for the sputtering process to occur. The DC power supply 22 converts unregulated AC line power to regulated DC power suitable for initiating the sputtering process within the sputtering chamber 14. The DC power supply 22 may comprise any suitable form of power supply, for example, a switched mode power supply, an SCR power supply or a diode-transformer power supply. However, the scope of the present disclosure is not limited by the specific type of DC power supply employed. As will be recognized by those skilled in the art, the nominal voltage generated by the DC power supply 22 needs to be suitable for the specific target material and sputtering operation being performed. Therefore, the scope of the present disclosure contemplates sputtering processes that employ a wide range of DC supply voltages.

In the system 10, the actual deposition of the sputtered coating from the cathode 18 onto the work piece 12 requires the ignition of a plasma within the chamber 12. The plasma is created by applying a voltage between the anode 20 and the cathode 18 that is sufficiently high to cause ionization of at least a portion of the sputtering gas contained within the chamber 14. The intense electric field associated with the applied DC voltage strips electrons from the gas atoms, creating anions and electrons that flow within the plasma. The anions are accelerated by the steady-state electric field created within the sputtering chamber 14 into the cathode 18 with sufficient kinetic energy to cause the anions to displace atoms from cathode 18. Some of the freed atoms from the cathode 18 combine with atmosphere that is present within sputtering chamber 14 at the beginning of the sputtering process. The remaining freed atoms from the cathode 18 that are uncombined also disperse throughout the sputtering chamber 14 and coat the exposed surfaces of the work piece 12. Throughout the above-described sputtering process arcing occurs intermittently due to various factors such as target poisoning, outgassing from work piece 12, contaminants, and the presence of material flakes within the sputtering chamber 14.

In sputtering applications an "arc" refers to a plasma state sustained by a relatively low voltage and high current. When an arc occurs within the sputtering chamber 12 the impedance of the plasma existing between the cathode 18 and the anode 20 dramatically decreases. This effectively causes a zero or near zero "impedance" condition to occur which causes a rapid rise in the cathode 18 current. More specifically, in the arc region, the plasma impedance collapses due to the regenerative gain and the thermal ionization of the arc discharge. All available energy being supplied by the DC power supply 22 is then driven into the arc discharge, which in turn generates extreme temperatures and even more thermal ionization. This in turn continues to lower the arc impedance of the chamber. It is the collapse of plasma energy (sheath) to essentially a point arc discharge that generates the massive energy densities which lead to particulates and damage of the target or work piece 12.

Figure 2:
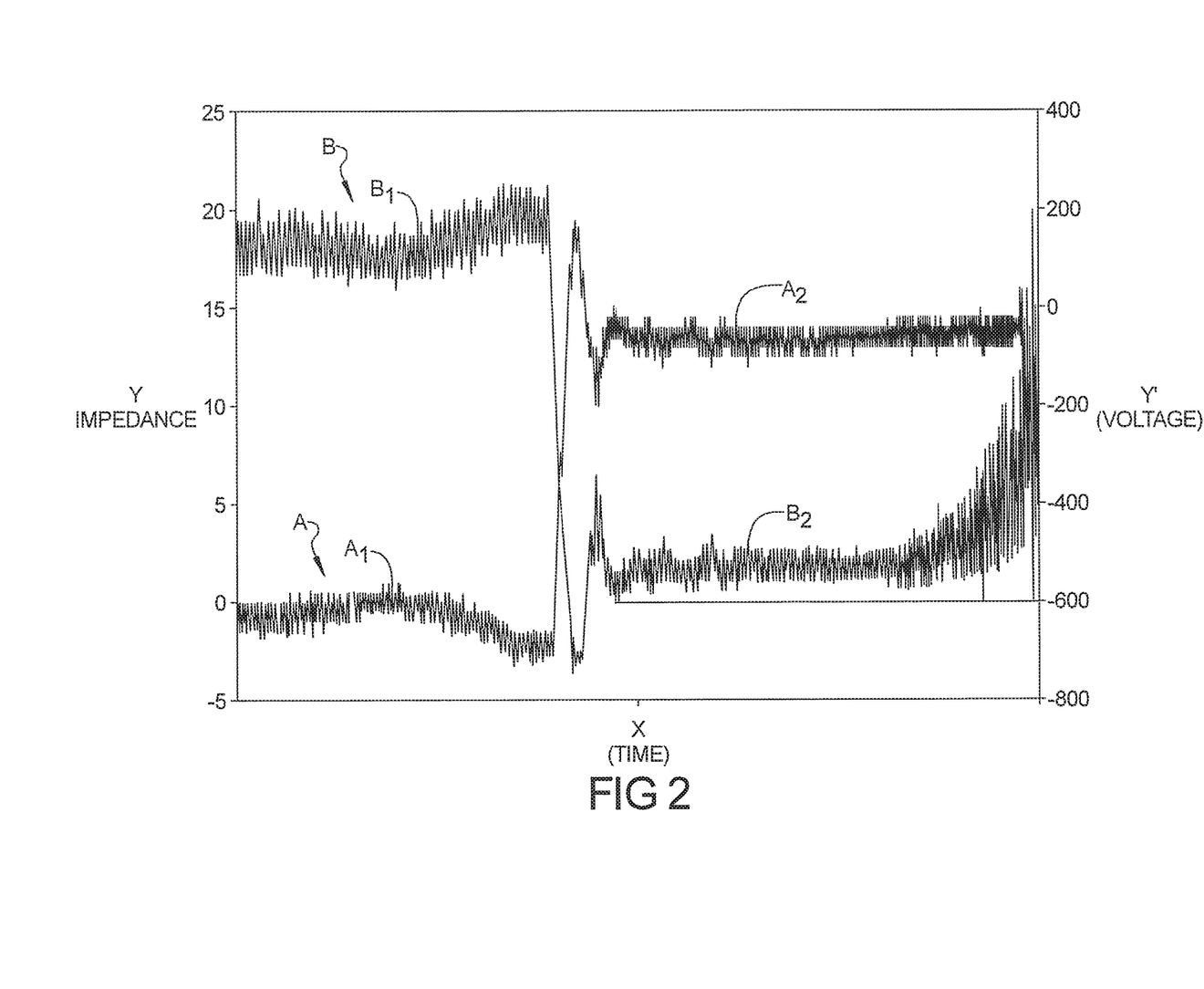
FIG. 2 is a signal diagram showing the voltage and impedance waveforms associated with the output of a DC power supply feeding a plasma chamber, when an arc occurs.

The relationship between the DC power supply output voltage and the impedance (i.e., resistance) of the plasma during an arc condition is also shown in the graph of FIG. 2. In FIG. 2 the DC power supply output voltage is depicted by a voltage waveform A having portions $A_1$ and $A_2$. Waveform portion $A_1$ represents the DC power supply 22 output voltage prior to the occurrence of an arc within the sputtering chamber 12, and portion $A_2$ illustrates the DC supply voltage subsequent to the arc event. The impedance of the plasma "seen" by the DC power supply 22 (i.e., effectively the cathode 18 to anode 20 impedance) is represented by waveform B having portions $B_1$ and $B_2$. The horizontal axis, X, of FIG. 2 represents time and the vertical axes, Y and Y', represent impedance and voltage, respectively.

As discussed previously, when an arc occurs, the impedance from cathode 18 to anode 20, as illustrated in FIG. 1, dramatically decreases. As shown in FIG. 2, the cathode 18 to anode 20 impedance is reduced sharply between waveform portions $B_1$ and $B_2$ indicating the occurrence of an arc within the plasma. During the same interval of time, the DC power supply 22 voltage output level experiences a sharp increase from waveform portion $A_1$ to portion $A_2$.

To detect the occurrence of an arc during the sputtering process the system 10 includes a detection module 32 that simultaneously monitors both the output voltage and the output current from the DC power supply 22. A sensed voltage signal is provided by a voltage sensor circuit 34 positioned across the output signal lines 24 and 26. A current sensor circuit 36 is disposed in series with output signal line 26 and provides a sensed current signal. As will be described in greater detail in the following paragraphs, the detection module 32 uses the sensed voltage, sensed current, and a pre-selected resistance value to detect when the impedance of the plasma has fallen to a level indicating that an arc has occurred. In this manner the detection module 32 can effectively monitor the state (i.e., the impedance) of the plasma within the chamber 14 during the sputtering process, and more specifically the impedance between the cathode 18 and anode 20. This is in contrast to conventional arc detection systems and methods that have relied on a voltage limit, a current limit, or monitoring the rate of change of the voltage (dV/dT) or current (dI/dT) to detect the occurrence of an arc.

Figure 3:
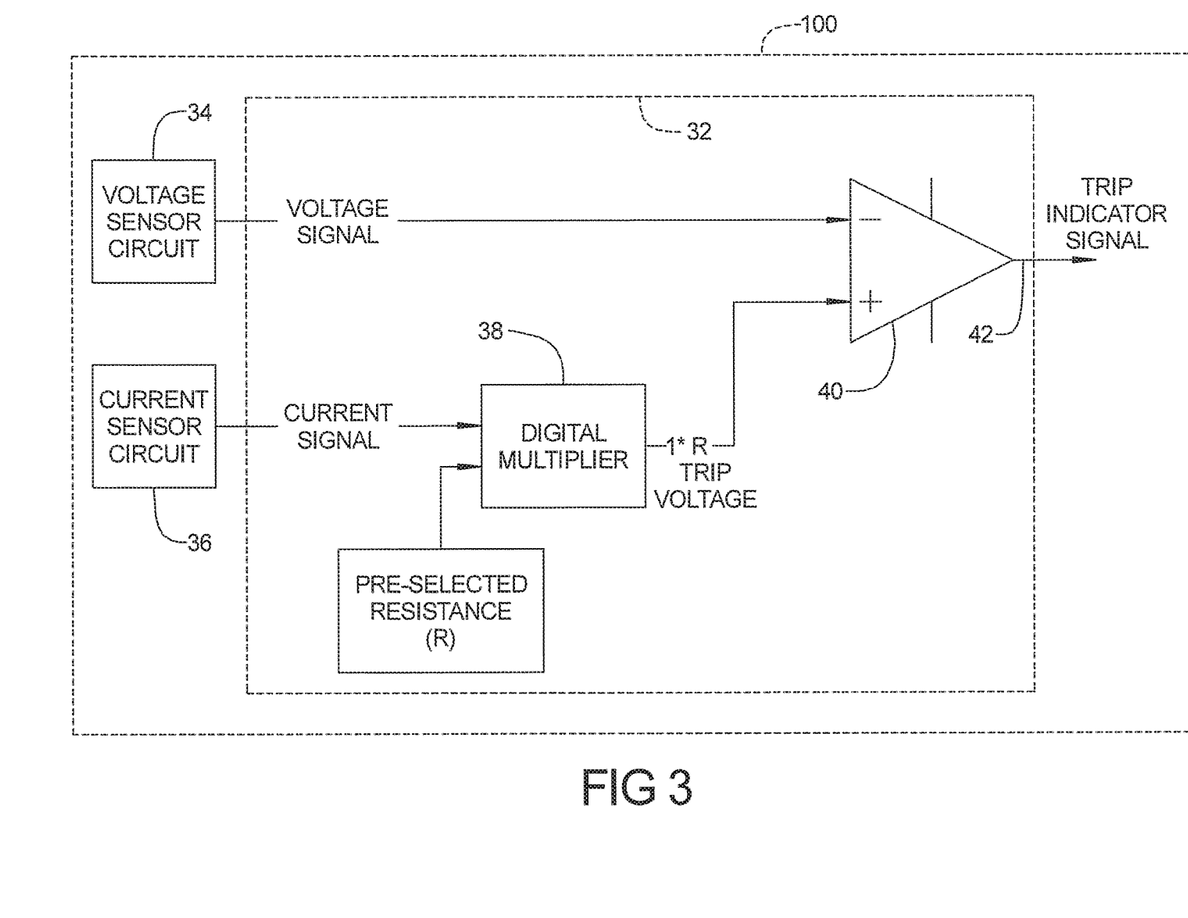
FIG. 3 is a schematic diagram of one embodiment of a detection module of the present disclosure designed to monitor the impedance of the plasma within the sputtering chamber during a sputtering operation.

With reference to FIG. 3, one embodiment of the detection module 32 is shown in detail. The detection module 32 includes a pre-selected resistance value, "R", a digital multiplier 38 and a comparator 40. The digital multiplier 38 receives an input from the current sensor circuit 36 that is indicative of the real time output current (I) being supplied from the DC power supply 22, as well as the pre-selected resistance value R. The value of R is selected based on previously observed characteristics of the DC output voltage and output current for a specific DC Plasma application when an arc is known to be occurring within the chamber 14, or after study of the normal operation of the Plasma. The resistance value R acts as a scaling factor, or multiplier, that tunes the detection module 32 to the output of the particular DC power supply being used and the known arcing characteristics of a specific sputtering application. Although the specific value of R is dependent on a specific application, it is anticipated that in many instances an appropriate value will be in the range of about 1 ohms-6 ohms, but not limited to this range. The digital multiplier 38 multiplies these values to form an I×R "trip" voltage. This trip voltage is applied to the non-inverting (+) input of the comparator 40. The inverting input (−) of the comparator 40 receives the sensed voltage signal from the voltage sensor circuit 34 that is indicative of the real time DC voltage output signal (V) being applied across the cathode 18 and the anode 20.

When an arc occurs, the trip voltage being the input to the non-inverting (+) input of comparator 40 rises significantly over a very short period of time. The comparator 40 continuously compares the I×R trip voltage being applied to its non-inverting input against the sampled voltage signal from the voltage sensor 34 that is being applied to its inverting input. Comparator 40 provides an output 42 that forms a "trip indicator" signal. The trip indicator signal signifies that the I×R trip voltage has risen to a point where it is equal to or greater than the sampled DC voltage signal on the inverting input of the comparator 42. This condition signifies that the impedance of the plasma between the cathode 18 and anode 20 has dropped sufficiently to a point where it defines accurately, consistently, and repeatably that an arc is in a state of occurrence.

When the detection module 32 generates the trip indicator signal, this signal could optionally be applied to a controller that is able to either shut down the DC power supply 22 or temporarily reduce the DC output voltage of the supply. The trip indicator signal could alternatively be applied to a different component of the sputtering system 10 in an effort to temporarily interrupt or reduce the DC output power to ameliorate the arc condition.

For the embodiment illustrated in FIG. 3, it is important to note that detection module 32 is preferably disabled for a short time period, typically between about 10 μs-100 μs, at the initial startup of the DC power supply 22. This is done to avoid the occurrence of a false arc indication. If the detection module 32 was to be energized simultaneously with the DC power supply 22 a condition would likely develop at the instant of turn-on where the comparator 40 is receiving a zero voltage signal on its inverting input and a zero voltage signal on its non-inverting input, which could thus immediately cause the comparator to generate a false trip indicator signal at its output 42. This very brief delay at startup may be achieved through a suitable hardware control system or a software control that delays, for a brief instant, the turn-on of the comparator 40 for a time that will allow the DC output voltage of the DC power supply to ramp up to a predesignated value. Once the detection module 32 is operational, it will not generate a trip indicator signal unless an arc condition is detected.

Therefore, the detection module 32 is able to monitor, in real time, the fluctuating impedance of the plasma within sputtering chamber 14 during the operation of sputtering system 10. By determining the trip voltage as a function of R, which is fixed, and the measured current at the output of DC power supply 22, the arc detection or trip indication level of detection module 32 becomes directly proportional to the fluctuating impedance of the plasma generated within the sputtering chamber 14 as the sputtering process in carried out.

A particular advantage of the detection module 32 is that by using a pre-selected resistance value, the voltage trip level may be easily tailored to various sputtering systems employing different DC supply voltages. The detection module 32 does not suffer from the limitations that can affect operation of voltage limit systems, current limit systems, dI/dT based systems or dV/dT based systems. Since the voltage trip indicator makes use of sampled DC output voltage and output current signals that are representative of the output of the DC power supply 22, the voltage trip level is able to change or "float" in relation to the output from the DC power supply 22. Thus, if power from the DC power supply 22 needs to be reduced for a particular sputtering operation, the trip voltage will be automatically scaled down because of the drop in output current that the digital multiplier 38 will see from the current sensing circuit 36. Furthermore, the detection module 32 is not dependent on the occurrence of a sharp drop (with respect to time) of either the DC output voltage or the output current from the DC power supply 22. Thus, the detection module 32 is able to detect the occurrence of "fireball" or "high impedance" arcs that generally occur without a sharp change in the sensed voltage or current. The detection module 32 also is not susceptible to providing trip signals that erroneously indicate the occurrence of an arc.

Still another advantage of the detection module 32 is that since it monitors the impedance of the plasma, it is essentially immune to spurious operation that previously developed detection system have suffered from as a result of focusing on only a sensed voltage, or on only a sensed current. Neither the end of a strike condition nor the time during a recovery from an arc will create a condition in the plasma where its impedance will drop sufficiently to approach the value of R. As a consequence of this limitation, the detection module 32 is kept from functioning improperly during "end of strike" and "recovery" conditions while the sputtering process is being carried out.

Figure 4:
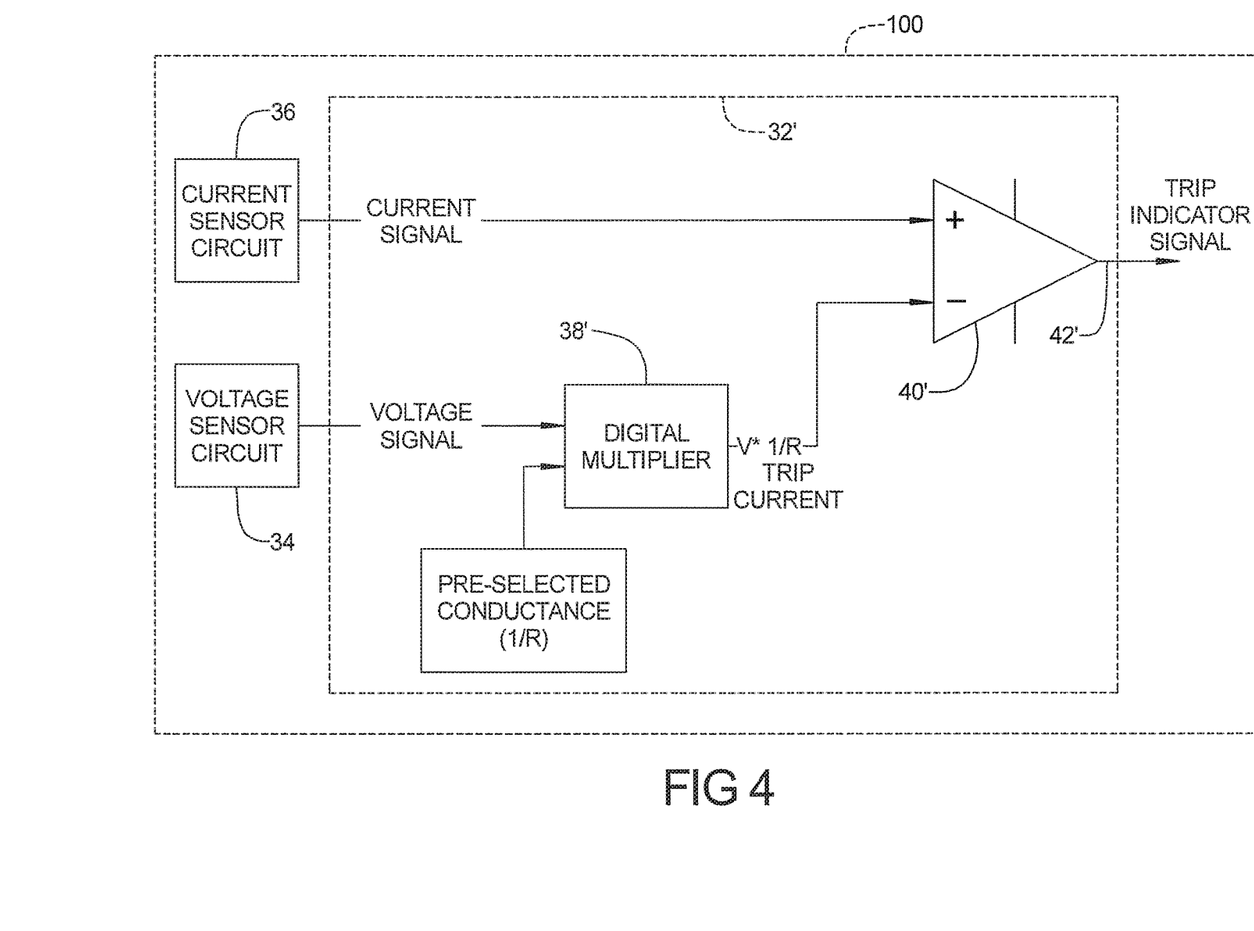
FIG. 4 is a schematic diagram of another embodiment of a detection module that monitors the conductance of the plasma within the sputtering chamber during a sputtering operation.

In the embodiments described above it will be appreciated that while the detection module 32 may utilize R at a specific power level for sputtering system 10 to identify the existence of an arc, the scope of the present disclosure is not limited to only monitoring impedance of the plasma. For example, the detection module 32 could just as readily be configured to monitor the conductance (i.e., 1/resistance or "G") of the plasma. Such an embodiment of the detection module is shown in FIG. 4 where the detection module is labeled 32'. Other components of the detection module 32' in common with those of FIG. 3 are labeled with corresponding reference numbers that are also designated with a prime (') symbol. In this implementation when an arc occurs the conductance of the plasma increases significantly, and essentially inversely to the impedance of the plasma. The trip signal comprises a trip current that is generated by multiplying the sensed voltage signal (V) by 1/R, where 1/R represents a pre-selected conductance value. The trip current is applied to the inverting input (−) of the comparator 40' while the sensed current signal is applied directly to the non-inverting (+) input of the comparator 40'. When the sputtering process is taking place and no arcing is occurring, the trip current will normally be higher than the sensed current signal. However, when an arc occurs the conductance of the plasma will rise significantly, and typically over a short period of time. The comparator 40' senses this condition when the sensed current signal on its non-inverting input equals or exceeds the trip current applied to its inverting input. The comparator 40' then generates a trip indicator signal 42' indicating that arcing is occurring.

The various embodiments of the detection module 32 may be implemented in a single integrated circuit or by discrete components. Additionally, detection module 32 may be implemented in connection with software, firmware or other hardware depending on the needs of a specific application.

The foregoing description is merely exemplary in nature and, thus, variations that do not depart from the gist of the teaching are intended to be within the scope therein. Such variations are not to be regarded as a departure from the spirit and scope of the teachings presented herein.

What is claimed is:

1. A method for controlling a plasma system, the method comprising:
   supplying direct current (DC) power to an anode of a process chamber and to a cathode of the process chamber sufficient to generate a plasma within said process chamber; and
   detecting an occurrence of an arc in said process chamber by monitoring at least one of an impedance and a conductance of said plasma during a plasma operation being performed within said process chamber, wherein the detecting further comprises further comprises one of:
      multiplying a sensed current signal by a pre-selected resistance value to generate a voltage trip signal, and comparing a sensed voltage signal to the voltage trip signal and if the sensed voltage signal is less than the voltage trip signal, generating a voltage trip indicator signal; or
      multiplying the sensed voltage signal by a pre-selected conductance value to generate a current trip signal, and comparing the sensed current signal to the current trip signal and if the sensed current signal is greater than the current trip signal, generating a current trip indicator signal.

2. A method for controlling a system, the method comprising:
   supplying direct current (DC) power to an anode of a process chamber and to a cathode of the process chamber sufficient to generate a plasma within the process chamber; and
   detecting an occurrence of an arc in the process chamber by monitoring at least one of an impedance and a conductance of the plasma during a plasma operation being performed within the process chamber including:
      receiving a sensed voltage signal or a sensed current signal indicating a respective voltage or current applied to the process chamber via the anode and the cathode;
      multiplying one of the sensed current signal or sensed voltage signal by a respective pre-selected resistance value or pre-selected conductance value to generate one of a respective voltage trip signal or current trip signal; and
      comparing the one of the sensed voltage signal or the sensed current signal to the respective voltage trip signal or the current trip signal and if the sensed voltage signal is less than the voltage trip signal, generating a voltage trip indicator signal, or if the sensed current signal is greater than the current trip signal, generating a current trip indicator signal.

3. The method of claim 2, wherein detecting the occurrence of an arc in the process chamber by monitoring at least one of an impedance and a conductance of the plasma further comprises monitoring the conductance of the plasma, and wherein the monitoring further comprises monitoring a current flowing between the anode of the process chamber and the cathode of the process chamber and generating the sensed current signal therefrom.

4. The method of claim 2, wherein detecting the occurrence of an arc in the process chamber by monitoring at least one of an impedance and a conductance of the plasma further comprises monitoring the impedance of the plasma, and wherein the monitoring further comprises monitoring a voltage across the cathode and the anode and generating the sensed voltage signal therefrom.

5. The method of claim 3, further comprising simultaneously monitoring the voltage across the cathode and the anode while a sputtering operation is occurring within the process chamber.

6. The method of claim 4, further comprising simultaneously monitoring the current across the cathode and the anode while a sputtering operation is occurring within the process chamber.

\* \* \* \* \*